United States Patent [19]

Key

[11] 4,118,094

[45] Oct. 3, 1978

[54] ZERO-ENTRY FORCE CONNECTOR

[75] Inventor: Edward H. Key, Wheaton, Ill.

[73] Assignee: TRW Inc., Elk Grove Village, Ill.

[21] Appl. No.: 783,152

[22] Filed: Mar. 31, 1977

[51] Int. Cl.[2] ........................ H01R 13/54; H05K 1/07

[52] U.S. Cl. .............................. 339/75 MP; 339/176; 339/176 MP

[58] Field of Search ...... 339/75 MP, 75 ML, 176 MP

[56] References Cited

U.S. PATENT DOCUMENTS

| | | | |
|---|---|---|---|
| 3,188,598 | 6/1965 | Pfero | 339/75 MP X |
| 3,710,303 | 1/1973 | Gallager | 339/75 MP X |
| 3,932,016 | 1/1976 | Ammenheuser | 339/75 MP X |

FOREIGN PATENT DOCUMENTS

| | | | |
|---|---|---|---|
| 2,423,266 | 12/1974 | Fed. Rep. of Germany | 339/75 MP. |
| 885,040 | 12/1961 | United Kingdom | 339/176 MP |

*Primary Examiner*—Roy Lake

*Assistant Examiner*—E. F. Desmond

*Attorney, Agent, or Firm*—Neuman, Williams, Anderson & Olson et al.

[57] ABSTRACT

An electrical connector is provided for electrically interconnecting the conductive terminals of a flat electrical circuit-bearing structure such as a circuit board with a backplane or the like. The connector includes a housing having a slot, into which the flat electrical circuit-bearing structure is inserted, and a carrier mounted for reciprocal movement in the slot to move the flat structure as it is inserted. A contact strip mounted on the carrier moves with the carrier and also is movable transversely thereof by a cam action to engage the flat structure's conductive terminal as the flat electrical structure is inserted. A resilient portion of the contact strip extends from the carrier to another portion fixed in the housing and urges the carrier outwardly of the slot and into abutment with the inserted electrical element.

14 Claims, 5 Drawing Figures

FIG. 1
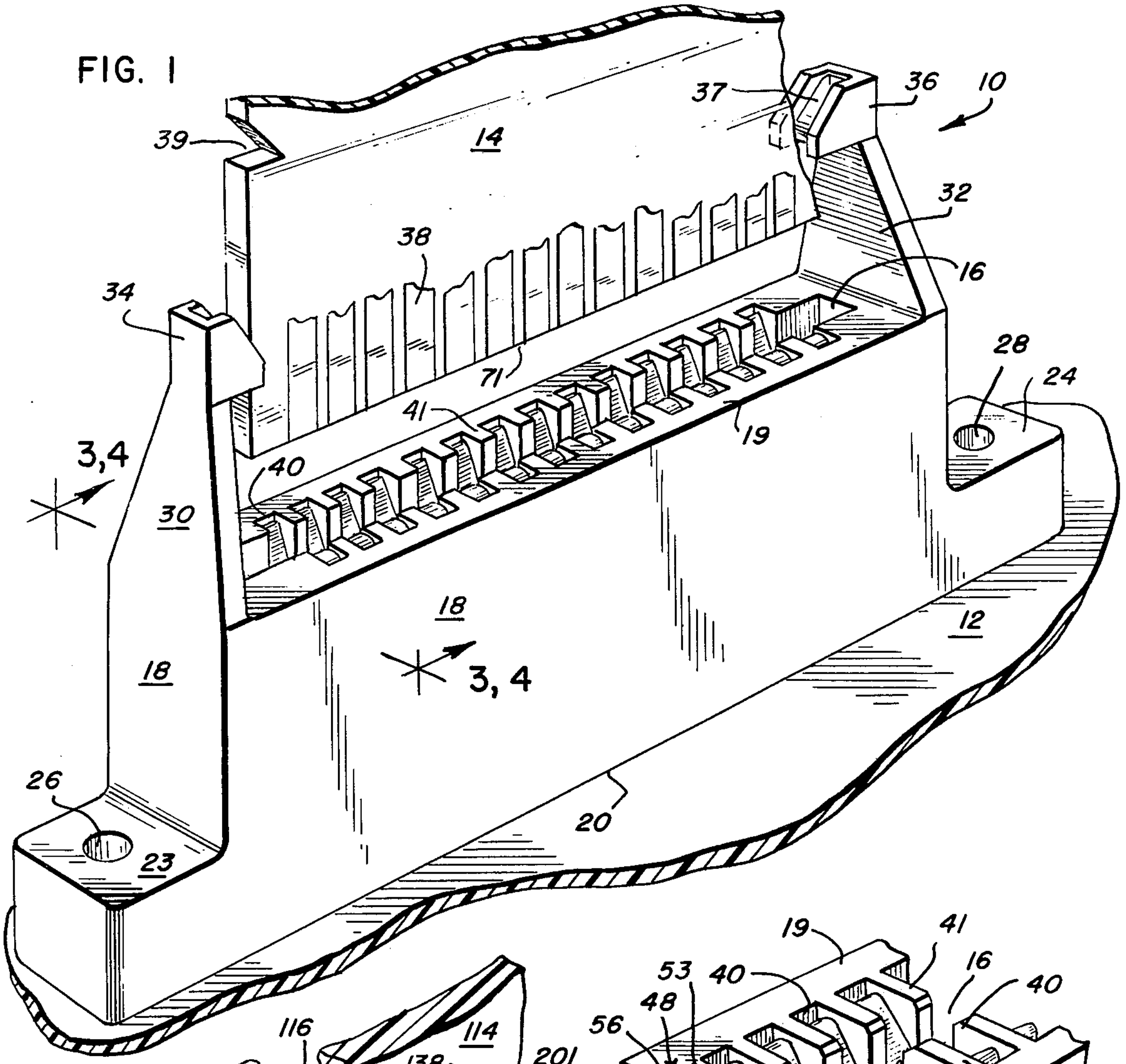
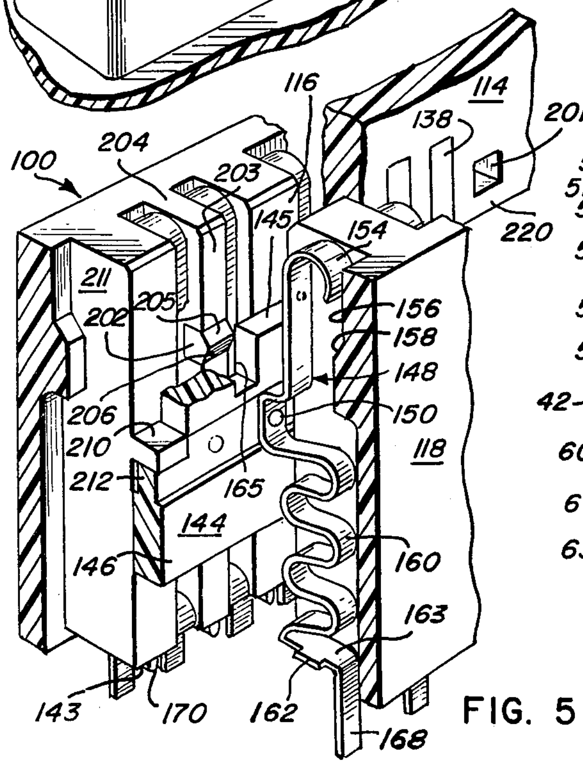
FIG. 5
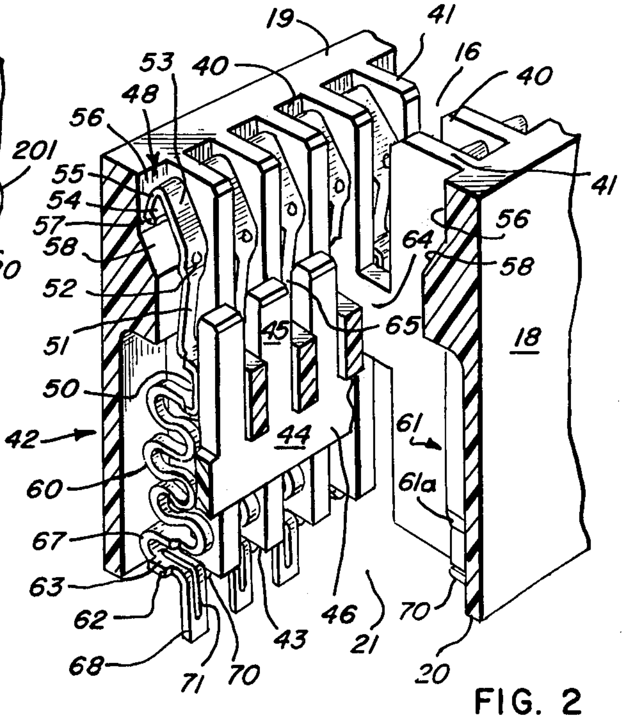
FIG. 2

ZERO-ENTRY FORCE CONNECTOR

This invention relates to connectors, and more particularly to improvements in electrical connectors of the zero-entry or zero-insertion-force type for establishing solderless connections between flat structures and conductive terminals.

With the advent of printed circuit boards, electrical pathways thereon have been established by a thin coating of an electrically conductive material printed, deposited or otherwise formed on one or both sides of the board for the purpose of interconnection. The miniature size of the circuits as well as the frailty of the electrically conductive material printed on the board have frequently posed substantial interconnection problems. Generally, to establish a solderless connection between a printed circuit board and a backplane, for example, a connector of one of a variety of configurations is employed. Such a connector mechanically mounts the board on the backplane while also establishing the requisite electrical interconnections. The mere interconnection, by the forcible pressing of a conductive contact within the connector against the interconnection points of the board may result in excessive wear on the interconnection points of the board as the parts are mated and unmated. Indeed, in some instances a single mating action which permits relative longitudinal sliding of the mating points may cause unaccepted wear. There is a conflicting requirement for a mating normal force between mating electrical elements to provide adequately reliable electrical interconnection. Correspondingly, this may result in a substantial withdrawal force to remove the board from the connector and out of electrical contact with the backplane, also resulting in wear on the interconnection points of the board. Various so-called zero-entry-force or zero-insertion-force connectors have been proposed to overcome these problems. Basically, these designs rely on linkage and/or cam designs by means of which the contacts of the connector engage with the electrical pathways on the board via transverse movement of the contacts as the board is inserted into the connector, to thereby minimize or eliminate sliding contact action, e.g., as in British Pat. No. 885,040 and U.S. Pat. Nos. 3,422,394 and 3,920,302. However, such prior proposals present a variety of complexities and shortcomings.

Connectors which employ complicated or exacting contact strip designs or connector arrangements, which do not assure exclusively transverse movement of the contact strip within the connector relative to the board, or require a multiplicity of parts, are both unreliable and costly. In some cases an inconvenient second step, after insertion of the board, is required to make the interconnection.

It is an object of this invention to provide improved zero-entry-force connectors.

It is a further object of the present invention to provide improved, low cost, and simplified connectors for assuring electrical interconnection between two electrical elements.

It is another object of this invention to provide a connector which will insure an electrical interconnection between the two elements, while alleviating circuit board wear and permitting ease of circuit board withdrawal.

It is still another object of this invention to provide a connector of unitary construction and which employs a contact strip simple in design yet effective in use.

In one illustrative embodiment of this invention, the foregoing objects are achieved by a connector which includes a housing having an open-ended pocket or slot adapted to accept one edge of a circuit board. A carrier member mounted within the slot is adapted to abut with the circuit board edge and move therewith. Contact strips mounted on the carrier are comprised of three portions. A first portion is attached to the carrier and is adapted for relative movement generally transversely of the carrier movement. A resilient second portion held in a fixed position on one end, is adapted to progressively bias the carrier member outwardly as it is moved inwardly, relative to the open end of the slot, and is attached at the opposite end thereof to the carrier member. A third portion is fixedly mounted on the housing and is adapted for electrical contact with a backplane or the like to which the connector is attached. The third portion is affixed at one end to the second portion of the strip.

Other objects, advantages and features of the invention will become apparent upon reading the following detailed description and appended claims, and upon reference to the accompanying drawings.

For a complete understanding of this invention, reference should now be had to the embodiment illustrated in greater detail in the accompanying drawings and described below by way of an example of the invention.

FIG. 1 is a perspective view of a preferred embodiment of a connector employing principles of this invention, with a circuit board shown partially broken away and in position for insertion.

FIG. 2 is a fragmentary side perspective view of the connector of FIG. 1, partially broken away.

FIG. 5 is a fragmentary perspective view of another embodiment of the connector of FIG. 4, shown with a correspondingly modified circuit board.

Figure 3:
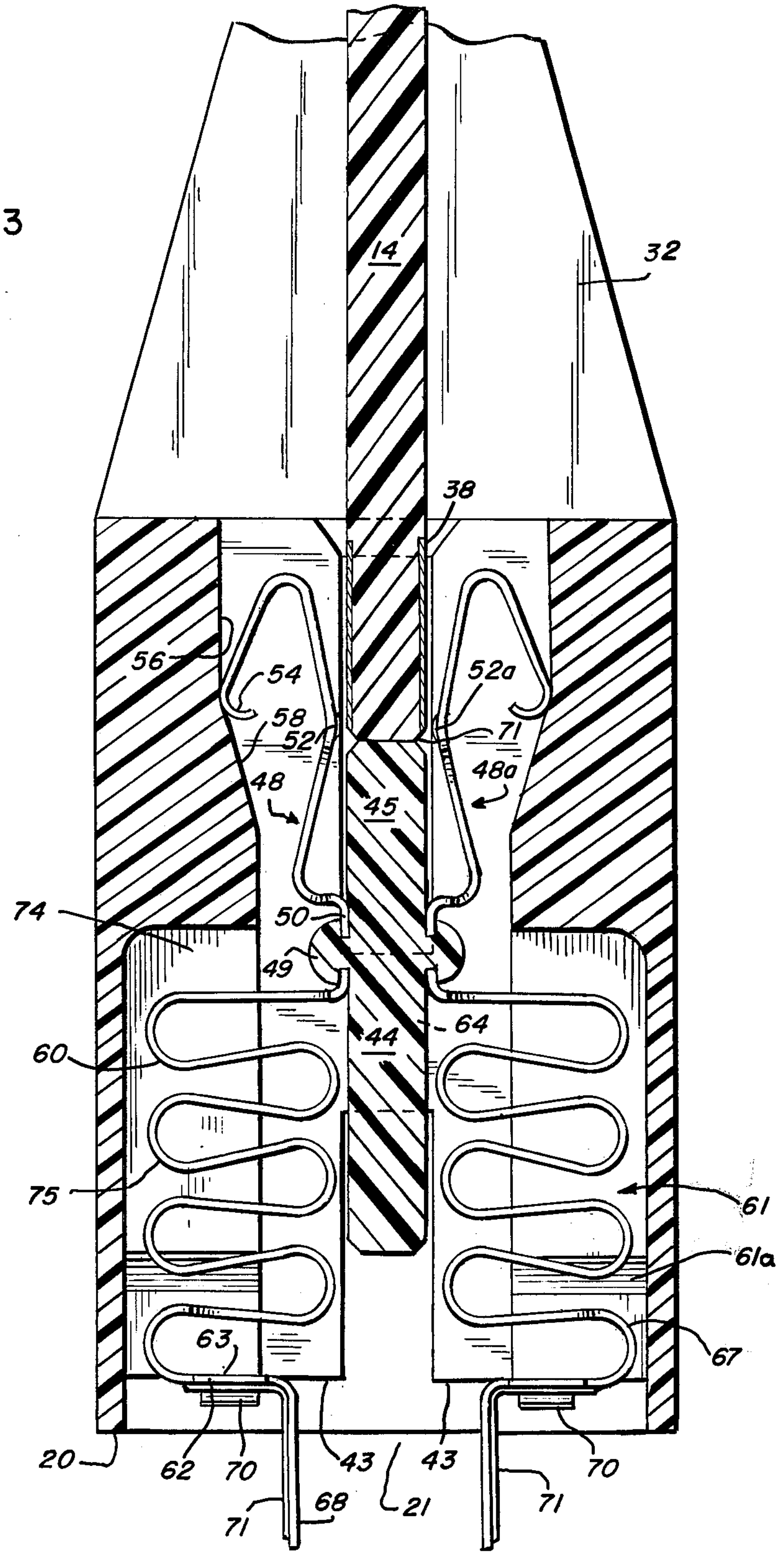
FIG. 3 is an enlarged sectional view of the connector of FIG. 1 taken along line 3—3, shown with a printed circuit board partially inserted therein.

While the invention will be described in connection with a preferred embodiment and one alternate embodiment, it will be understood that it is not limited to those embodiments.

Turning now to the drawings and principally FIG. 1, the preferred embodiment of a connector according to the invention is shown generally at 10. The connector is illustrated as mounted on a suitable backplane 12, ready to receive a printed circuit board 14 through slot 16 in the connector 10. The connector, which is preferably molded from a non-conductive plastic material, includes sidewalls 18 and a top 19. Mounting flanges 23, 24 extend outwardly from opposite sidewalls 18, and are provided with openings 26, 28 therethrough to receive securing screws (not shown) or the like to hold the connector 10 in place on backplane 12. Extending upwardly from top 19 of connector 10, at opposite sidewalls 18, are arms 30, 32. The connector 10, including arms 30, 32 is molded from a flexible plastic-like material with arms 30, 32 being slightly inclined toward each other.

Circuit board guides 34, 36 are integral with arms 30, 32 and are positioned on the upper ends thereof. Guides 35, 36 are essentially U-shaped, and are adapted to guide a circuit board 14 into the open-end of pocket or slot 16 in connector 10. A snap element 37 extends between the U-shaped portions of each guide 34, 36. Insertion of the circuit board 14 between guides 34, 36 and over respective snap elements 37 causes arms 30, 32, to separate, flexing the arms. When the circuit board 14 has been fully inserted, the arms assume their original position as snap portions 37 snap into cut-out slots 39 provided on circuit board 14 securing the board in place.

As outlined above, the circuit board 14 is received in to slot 16 provided in top 19 of the connector 10. Corresponding with the thin conductive terminal strip portions 38, normally provided on circuit board 14, are contact slot recesses 40 which are open to the slot 16. A series of ribs 41 are disposed along slot 16 and extend from opposite sidewalls 18 of connector 10 to define the slot recesses 40. Depthwise, each rib 41 extends from top 19 to a point 43 just above edge 20 of sidewalls 18 (see FIGS. 3 and 4). Thus, ribs 41 are recessed from edge 20 so as to provide a clearance between ribs 41 and backplane 12 when the connector 10 is in place.

Figure 4:
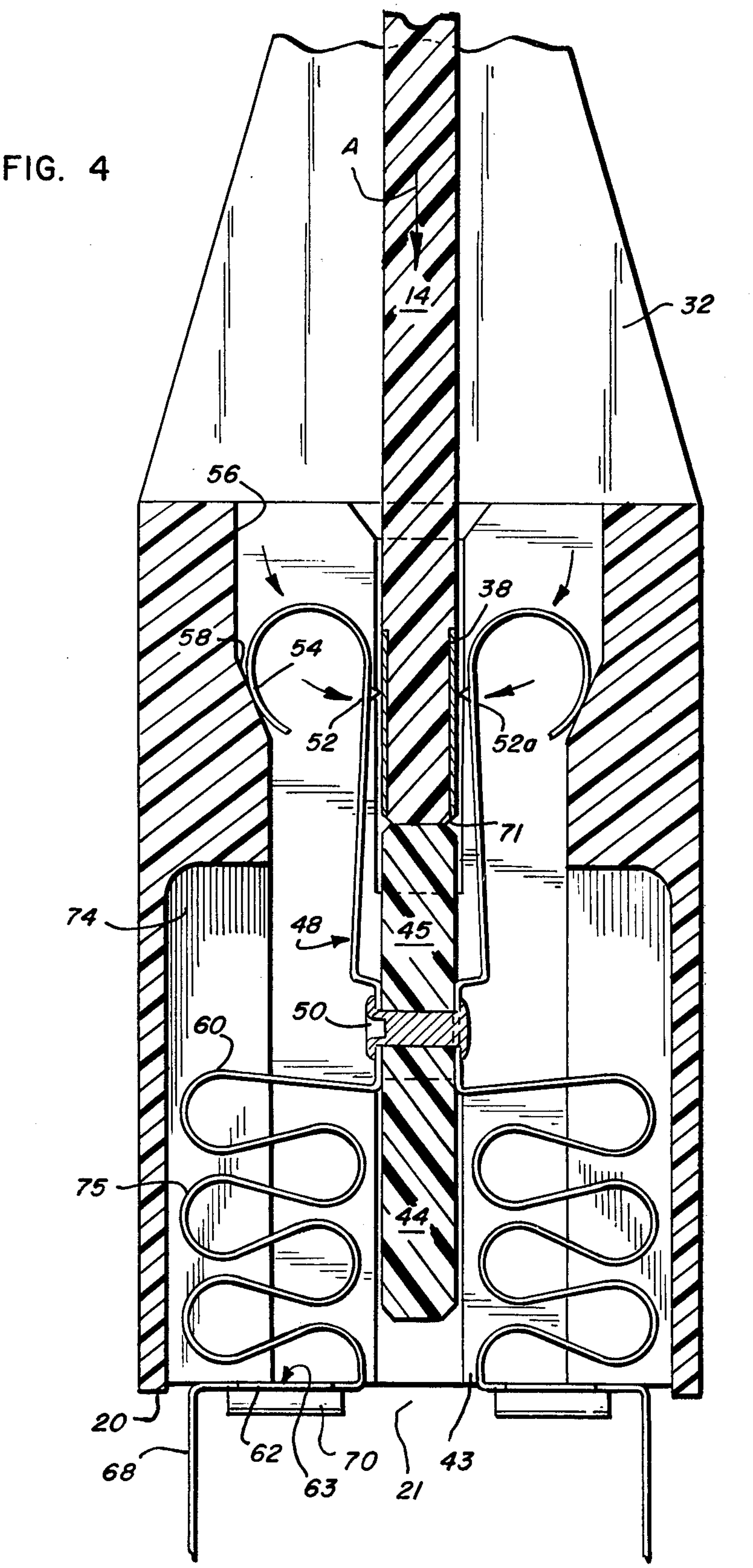
FIG. 4 is an enlarged sectional view of a connector similar to that of FIG. 1 taken along line 4—4, but showing an alternate embodiment of the contact strip, with the printed circuit board shown fully inserted therein.

Referring now to FIG. 2 components of the connector which are carried within slot 16 to establish electrical connection with the circuit board 14 are shown generally at 42. The components include a carrier block 44 extending along slot 16, transversely of the recesses 40, and a plurality of contact strips 48. The recesses 40 normally are provided in opposed pairs as shown in FIGS. 3 and 4. A contact strip 48 typically is provided for each recess 40.

The carrier 44 is mounted for reciprocal movement between an upper position relative to the connector top 19, as shown in FIG. 3, and a lower position adjacent connector base opening 21 as shown in FIG. 4. A plurality of elongated carrier arms 45 extend upwardly from the carrier base 46, being adapted to abut with the edge of a circuit board inserted in slot 16, and thereafter causing carrier 44 to move with the board.

Each contact strip 48 is a unitary strip of electrically conductive material and is fixedly attached along segment 50 thereof, to carrier 44 via a heat-sealing nub 49 (FIG. 3). Extending angularly upwardly from the carrier 44, are strip parts 51, 53, 55. A contact point 52 is formed at the junction of parts 51, 53 as an inwardly extending dimple. Strip part 55 is turned back at its one end 57, and the parts 55, 57 act as a cam follower 54. Strip parts 51, 53, 55, and therefore contact point 52 and cam follower 54, move longitudinally with the carrier 44. Contact point 52 is adapted to make electrical contact with a terminal portion 38 of circuit board 14, as will be more fully explained below. Because of the angular extension of the contact strip from the carrier 44 and an outwardly resilient bias due to the configuration of the strip and the springiness of the strip material, the cam follower section 54 will abut against the housing wall 56 defining the outer wall of the respective recess 40. It should be appreciated that strip part 51 is of a narrower configuration than parts 53, 55, so as to more precisely determine the spring force holding cam follower 54 against housing wall 56. Each housing wall 56 includes an inwardly inclined cam segment 58 over which the cam follower portion 54 will travel as the carrier 44 is moved to its lower position. Movement of the cam follower portion 54 over the inclined segment 58 will cause the contact portion 52 to move transversely of the carrier and thus transversely of the slot 16.

Extending downwardly from carrier 44 is a resilient carrier-biasing portion 60 on each contact strip 48. The carrier-biasing portion 60 is of a bent or convoluted configuration, being fixedly attached to the carrier 44 at segment 50 of contact strip 48. The exact shape of the bends or convolutions are determined by the resilient qualities of the material, the distance over which the carrier is required to move, and the amount of restraining force desired. Biasing portion 60 also serves as a compression spring and urges the carrier 44 into its upper position, as shown in FIGS. 2 and 3. Portion 60 is of a narrower dimension relative to segment 50 of strip 48, so as to assure the precise determination of spring force generated thereby. To prevent the narrow spring portion from buckling sideways when a circuit board is inserted and the spring is compressed, lower housing walls 61 on opposite sides of spring 60 extend into recess 40 from recess-defining ribs 41 to define a narrower channel through which the spring portion extends. As such, the walls 61 more closely confine the narrow and more frail spring portion 60 and thereby prevent the portion from buckling. The sidewalls 61 span only an outer portion of the lateral depth of ribs 41, so as to permit insertion and removal of the contact strip 48 from the connector housing 10 through the bottom opening 21 thereof during initial assembly. The wider extent of the strip 48 along parts 53, 55, and element 50 would otherwise be prevented from passing through the recesses 40 when the connector is being assembled. It should also be noted that at the bottom-most convolution 67 of spring portion 60, the width of the strip 48 increases to its larger dimension. Correspondingly, housing sidewall 61 transitions, at 61*a*, to define a wider channel in which convolution 67 can extend.

Housing portions 64, extend across slot 16 between the carrier arms 45 and limit the upward movement of carrier 44. In addition, portions 64 limit the extent to which a circuit board may be inserted into the connector 10. Openings 65 between carrier arms 45 are provided to accommodate housing portions 64, so as to permit limited movement of the carrier 44. The uppermost extension of the carrier 44 is reached when the top edge of the carrier base 46 abuts against the lower edge of housing portions 64. As the carrier 44 assumes its lower position adjacent base opening 21, the biasing portion 60 will increasingly urge the carrier to its upper position, as more fully explained below.

A final contact portion of each strip 48 includes a flat horizontally-extending piece 63 adjacent final convolution 67 and a downwardly extending terminal 68 which is adapted to make appropriate electrical connection with backplane 12 or components associated therewith. When the strip 48 is in place, ears 62 exend outwardly from piece 63 so as to extend over a portion of each adjacent edge 43 on adjacent ribs 41. As strip 48 is inserted into the connector 10 through the underside thereof, ears 62 will limit the insertion of the strip 42 as they abut against edges 43 of ribs 41. Nubs 70, protruding from edge 43 of each rib 41, are positioned centrally of each respective edge 43 and do not interfere with the abutting relationship of the ears against the edges 43. The application of heat to sealing nubs 70 will cause portions thereof to melt and flow over ears 62 of each strip 48. When the heat source is removed, the strip 48 will be secured to ribs 41 of connector 10. Because the lower edges 43 of ribs 41 are recessed from edge 20 of sidewalls 18, piece 63 of strip 42 will not contact the surface of backplane 12 when the connector 10 is in place. This will alleviate the possibility of short circuits between strips 48 and elements on the backplane. The terminal 68 may be of a variety of configurations as adapted to any particular solderless connection requirement. A strengthening rib 71 may be formed along a substantial length of terminal 68 and piece 63.

A second opposing contact strip 48*a* is shown in FIGS. 3 and 4, which includes substantially the same portions, and functions as the contact strip 48 described above. As previously noted and as best shown in FIG. 1, it should be understood that a plurality of contact strips 48 are attached to carrier 44, each functioning as the one described when a circuit board is inserted.

A second embodiment of the configuration of the contact strips 48 is shown in FIGS. 4 and 5. The shape of the contact portion 52 and cam follower portion 54 has been modified without effecting the utility of the connector, and the strip 48 is of uniform widthwise dimension. In addition, the number of convolutions in the biasing portion 60 has been reduced, and the terminals 68 are mounted toward the outside of the connector. Again, such differences may be incorporated depending on the material utilized and the particular application of the connector. It should be understood that a variety of contact strip configurations incorporating the new and inventive features of this invention can be utilized without exceeding the scope of this invention.

In operation, the connector 10 is mounted on a backplane 12, with terminal 68 of contact strip 48 making electrical contact with electrical elements attached to the backplane 12. The circuit board 14 to be connected to the backplane 12 is inserted between arms 30, 32 of connector 10 and through guides 34, 36. The circuit board guides 34, 36 act to insure proper circuit board alignment with slot 16, into which the board 14 is inserted.

Upon insertion of the board 14 into the slot 16, edge 71 of the board will abut with carrier arms 45, as shown in FIG. 3. In this position, the contact portion 52 of each contact strip 48 is out of contact with the thin terminal portions 38 of board 14. Thus, frictional wear of the circuit board 14 and of the terminal portions 38 thereon is alleviated, which also minimizes the force necessary to insert the board 14 into connector 10. Continued insertion of the board in direction A (FIG. 4) will force carrier 44 to move downwardly. This movement causes the cam follower portion 54 of each contact strip 48, 48*a* to move inwardly along the respective inwardly inclined slot recess wall segment 58, thereby forcing each contact to flex inwardly toward the circuit board about the strip attachment to the carrier at portion 50. Each contact portion 52 thereby is moved from its outwardly biased relaxed state into engaging relation with terminal area 38 on board 14 as the cam follower portion 54 moves along the wall segment 58. Because the carrier 44 and each attached contact strip 48 move downwardly of the slot 16 jointly and simultaneously with the inserted circuit board 14, the contact portion 52 of each strip 48 moves, relatively, substantially only perpendicularly to the respective contact 38 as physical and electrical contact are established therebetween. As such, frictional wear of the thin conductive terminal portions 38 on circuit board 14 is minimized, increasing the useful life of the board.

Also being attached to the carrier 44 at portion 50, each convoluted portion 60 is compressed between carrier 44 and piece 63 secured to the housing ribs 41, thereby biasing the carrier 44 towards its upper position. When the carrier 44 is pushed to its lower position, as described and as shown in FIG. 4, the convoluted portions 60 resiliently compress or deflect further within housing 74, thereby increasingly urging carrier 44 toward its upper position. Each convoluted portion 60 includes coils or waves 75 of gradually curved or serpentine resilient conductive material, which insures resilient deflection while permitting the use of relatively thin contact strips 48 and 48*a*.

When the circuit board has been fully inserted into the connector 10, snap elements 37 will snap in place in intermediate cut-out portions 39 of the board. As such, the board will be securely retained within the connector 10.

To remove the circuit board from the connector, arms 30, 32 of the connector are manually deflected away from the circuit board 14, thereby retracting snap elements 37 from their locked position in cut-out portions 39. As the board is withdrawn, convoluted portions 60 tend toward their expanded positions, thereby urging the carrier 44 into its upper position and assisting in the removal of the board. The spring portion 60 insure that the carrier 44 moves upwardly in contact with the board as the board is withdrawn, thereby insuring reversal of the afore-described correlated mating action during unmating. That is, cam follower portions 54 move outwardly along the inclined segments 58 of housing walls 56 and cause contact portions 52 to withdraw perpendicularly from electrical contact with terminal portions 38, whereby the circuit board is withdrawn from the connector 10 without sliding frictional engagement with the contact strips 38.

Throughout the engagement and disengagement operations, the terminals 68 remain in their fixed positions. Accordingly, other conductors or circuit components may be affixed to these portions by any suitable means such as soldering, wirewrap or other connections as aforenoted.

Referring now to FIG. 5, another embodiment of a connector according to this invention is shown generally at 100. Corresponding elements or portions from the preferred embodiment and alternate embodiment of FIG. 4 have been labeled with the same number, as prefixed by a 1. The carrier 144, connector housing 118, and circuit board 114 have been modified so that the circuit board is self-retained within the connector 100. As such the connector of this embodiment does not require arms 30, 32, (as shown in FIG. 1) to retain the board within the connector.

Modified circuit board 114 includes an opening 201 formed in the board along the lower periphery thereof. A predetermined number of such openings are made in the circuit board according to this embodiment. The openings 201 are positioned such that when the circuit board 114 is inserted in slot 116 of connector 100, the openings will align themselves with detent-type retaining nubs 202 carried on selective inwardly facing sides 203 of housing ribs 204. Each nub 202 includes an upwardly facing cam surface 205 and a downwardly facing retaining surface 206. Each nub 202 is separate from housing ribs 204, and is mounted for slight resilient reciprocal movement within the cavity in which it is housed.

Housing portions 64, which extend across the slot 16 in the preferred embodiment, have been omitted from connector 100 and are replaced by a protruding portion 210 extending from a housing sidewall 211 at each end of the slot 116. Correspondingly, the carrier 144 has been modified to include a ledge 212 which is adapted to abut against portion 210 when the carrier is in its outward position. Because housing portions 64 are omitted, carrier arms 145 have been shortened in height, and opening 165 between the arms is correspondingly smaller, but extends so that the carrier 144 will not interfere with nub 202 as the carrier assumes its uppermost position, as shown.

As the modified circuit board 114 is inserted through slot 116, the lower peripheral edge 220 of the circuit board directly below an opening 201 abuts against cam surface 205 causing the nub 202 to retract. When the circuit board has been fully inserted, similar to what is shown in FIG. 4, opening 201 in circuit board 114 will be in alignment with the respective nub 202, such that the nub will partially extend into opening 201 and thereby retain the circuit board 114 within connector 100. It will thus be obvious that each nub 202 is positioned along housing rib 204 such that when the circuit board 114 is fully inserted within connector 100, the nub 202 will be aligned with an opening 201 in the circuit board. When the circuit board is in place, the compression of the convoluted portions 160 of the contact strips 148 will cause the lower wall of the circuit board defining opening 201 to contact retaining surface 206 of nub 202. However, the nub 202 is so designed and positioned within housing rib 204 as to prevent the nub 202 from being depressed until a greater withdrawal force is applied to the circuit board 114, as upon intentional manual withdrawal.

When the circuit board 114 is to be removed from the connector 100, a predetermined manual force is applied to dislodge the circuit board from the hubs 202. When a sufficient force has been achieved, the lower portions of the circuit board defining openings 201 will cam against surface 206, causing the nubs 202 to be compressed or to retract and thereby allowing the circuit board 114 to be removed therefrom.

As an example of a connector employing teachings of this invention, it has been found that a contact strip 48 formed of a unitary length of Beryllium Copper Alloy 25 having a width of between 0.025 and 0.030 inch along spring portion 60 and of between 0.060 and 0.070 inch at terminal end 68, with the strip having a thickness of between 0.003–0.005 inch, necessitated a circuit board insertion force of 50–60 grams for each pair of such strips. Upon withdrawing or releasing the circuit board from the connector, the board was initially urged outwardly by the spring with approximately 50–60 grams of force per pair of contact strips. The contact portion of the strip was of a slightly wider dimension, being 0.060 inch. Such a strip had sufficient resilient strength to follow the contour of the cam and to establish proper electrical contact with an inserted circuit board.

Thus, a zero entry force connector has been provided that is of simple yet effective construction, and is inexpensive to manufacture; yet is capable of securely and effectively establishing electrical contact between two components. While two embodiments of the invention have been shown, it will be understood, of course, that the invention is not limited thereto since modifications may be made and other embodiments of the principles of this invention will occur to those skilled in the art to which the invention pertains, particularly upon considering the foregoing teachings. It is, therefore, comtemplated by the appended claims to cover any such modifications and other embodiments as incorporate those features which constitute the essential features of this invention within the true spirit and scope of the following claims.

What is claimed is:

1. A zero entry force connector including a connector housing, a reciprocable carrier disposed in said housing, a plurality of contact strips each having a first end portion thereof attached to said housing, an intermediate portion formed into a smooth, rounded contact portion laterally movable within said housing, and a second end portion coacting with said housing for moving said contact portion laterally to effect electrical contact with an inserted element as said carrier is moved inwardly of said housing, and each of said contact strips forming a compression spring between said first end portion and said intermediate portion which is compressed as said carrier is so moved to thereupon urge said carrier outwardly of said housing.

2. The connector of claim 1, wherein the compression spring of each contact strip is confined between and attached to said carrier and the lower portion of the connector.

3. The connector of claim 2, wherein the compression spring is substantially serpentine in configuration.

4. The connector of claim 3, wherein each of said contact strips is of unitary construction.

5. A zero-entry force connector to provide electrical communication between two electrical elements comprising a connector housing of substantially non-conductive material;

a contact strip substantially within said housing and having a first end portion protruding from and secured to said housing for making continuous electrical contact with a first one of said elements and a second portion movable within said housing for making selective electrical contact with the second of said elements;

a carrier means fixedly attached to a medial portion of said contact strip and disposed within said housing for reciprocal movement therein under the force of the second of said electrical elements;

said contact strip including a compressive resilient portion disposed between said end portion of said strip and said medial portion for biasing said carrier means against the force of the said second electrical element, said contact strip also including a second resilient portion associated with the movable contact-making portion of said strip for providing an additional biasing force on said carrier means counter to the force of the second of said electrical elements while urging said movable contact-making portion laterally within said housing.

6. A zero-entry force connector to provide electrical communication between two electrical elements comprising a contact strip for secure and continuous electrical contact with one of said elements and selective electrical contact with the other of said elements, a connector housing of substantially non-conductive material which substantially contains said contact strip and into which a first of said elements may be inserted to establish such selective electrical contact with said contact strip, and a carrier means fixedly attached to said contact strip and disposed within said housing for reciprocal movement therein, said contact strip including a contact segment adapted to make electrical contact with the first electrical element when said element is inserted into said housing, a compressive spring constituting a portion of said contact strip and adapted to urge said carrier into abutting relation with the first element as it is inserted into said housing, and cam means formed in said housing and engagable by said contact strip, whereby said contact segment is moved laterally towards said first electrical element as said element is inserted into said housing and the abutting relation between said carrier and said first element substantially eliminates relative longitudinal movement between said contact segment and said first element.

7. The connector of claim 6, wherein said contact segment of said contact strip is attached to said carrier means for cantilever movement relative thereto by said cam means.

8. The connector of claim 6, wherein one end of said compressive spring portion of said contact strip is fixedly secured relative to said housing and the other end thereof is attached to said carrier for movement therewith.

9. The connector of claim 6, wherein said compressive spring portion of said contact strip is of a substantially serpentine configuration.

10. The connector of claim 6, wherein said contact strip further includes a portion which is fixedly attached to said housing and extends outwardly from said housing and is adapted for making said continuous contact with one of said elements.

11. The connector of claim 10, wherein said contact strip is of unitary construction.

12. The connector of claim 6, wherein said housing has a slot therein containing said contact strip and is provided with at least one recess extending laterally from said housing slot, said cam means being disposed within said housing recess.

13. The connector of claim 12, wherein a plurality of said slot recesses are in side-by-side relation extending transversely of said slot, and said connector includes a plurality of contact strips and at least said first contact strip portion of each of said contact strips being included within a corresponding slot recess.

14. The connector of claim 13, wherein said carrier is coextensive with said housing slot.

* * * * *